United States Patent
MacArthur et al.

(10) Patent No.: US 10,865,050 B2
(45) Date of Patent: Dec. 15, 2020

(54) MANUFACTURING PROCESS SWITCH FOR TRIGGERING AN EVENT WHEN OPENED

(71) Applicant: Honda Motor Co., Ltd., Tokyo (JP)

(72) Inventors: Benjamin MacArthur, Barrie (CA); Dwayne Switzer, Angus (CA)

(73) Assignee: Honda Motor Co., Ltd., Tokyo (JP)

( * ) Notice: Subject to any disclaimer, the term of this patent is extended or adjusted under 35 U.S.C. 154(b) by 520 days.

(21) Appl. No.: 15/691,117

(22) Filed: Aug. 30, 2017

(65) Prior Publication Data

US 2019/0068188 A1 Feb. 28, 2019

(51) Int. Cl.
| | | |
|---|---|---|
| *B65G 43/00* | (2006.01) | |
| *H03K 17/95* | (2006.01) | |
| *H03K 17/945* | (2006.01) | |
| *B62D 65/18* | (2006.01) | |
| *B23Q 11/00* | (2006.01) | |
| *B23Q 5/58* | (2006.01) | |

(52) U.S. Cl.
CPC ............... *B65G 43/00* (2013.01); *B23Q 5/58* (2013.01); *B23Q 11/0092* (2013.01); *B62D 65/18* (2013.01); *H03K 17/945* (2013.01); *H03K 17/9505* (2013.01)

(58) Field of Classification Search
CPC ...... B65G 43/00; B23Q 5/58; B23Q 11/0092; H03K 17/945; H03K 17/9505; B62D 65/18
See application file for complete search history.

(56) References Cited

U.S. PATENT DOCUMENTS

| | | | |
|---|---|---|---|
| 3,801,767 A | 4/1974 | Marks | |
| 6,989,727 B2 * | 1/2006 | Bachle | H01H 27/002 |
| | | | 200/43.07 |
| 7,199,688 B2 | 4/2007 | Edmonson, Jr. | |

(Continued)

FOREIGN PATENT DOCUMENTS

| | | |
|---|---|---|
| FR | 2488439 A1 | 2/1982 |
| GB | 2515127 A | 12/2014 |

OTHER PUBLICATIONS

Euchner Safety Hinges—www.euchner-usa.com accessed Mar. 30, 2017.

(Continued)

*Primary Examiner* — Gene O Crawford
*Assistant Examiner* — Keith R Campbell
(74) *Attorney, Agent, or Firm* — American Honda Motor Co., Inc.; Joshua Joel Freier

(57) ABSTRACT

A manufacturing process switch with a housing consisting of a first member and a second member. The first member is rotatable from a closed position to an open position. A proximity sensor is secured to the housing that detects the proximity of the first member to the second member and generates a signal when the first member is in the open position. An engagement device is secured to the housing for retaining the first member to the second member in the closed position. A cable attachment mechanism is attached to the first member of the housing and securable to a cable of a tool. The first member is rotatable from the closed position to the open position when a breakaway force is applied to the cable attachment mechanism. The manufacturing process is stopped when the first member is in the open position.

20 Claims, 6 Drawing Sheets

(56) References Cited

U.S. PATENT DOCUMENTS

| | | | |
|---|---|---|---|
| 7,205,872 B2* | 4/2007 | Baechle | H01H 27/007 |
| | | | 335/205 |
| 7,377,560 B2 | 5/2008 | Wiemer et al. | |
| 8,456,792 B2 | 6/2013 | Peczalski et al. | |
| 2017/0140890 A1* | 5/2017 | Tsang | H01H 71/50 |

OTHER PUBLICATIONS

Bernstein Integral Safety Hinge Switch—www.farnell.com accessed Mar. 30, 2017.
NYCE Door Hinge Sensor—www.nycesensors.com accessed Mar. 30, 2017.

* cited by examiner

MANUFACTURING PROCESS SWITCH FOR TRIGGERING AN EVENT WHEN OPENED

BACKGROUND

The embodiments described herein relate generally to a manufacturing process and a system for the assembly of parts and/or other components.

Various sensors and switches are commonly used in a manufacturing environment to stop manufacturing processes when the sensors or switches detect an abnormal condition. In the automotive vehicle manufacturing industry, parts are typically installed on an assembly line with various electrical power tools or pneumatic power tools. Electrical and pneumatic power tools require a cable, cord or hose for supplying electrical power or air pressure. During assembly operations, a power tool, electrical cord, cable, or pneumatic hose can inadvertently be left or caught in the assembly as it moves downstream for subsequent assembly operations causing possible damage to the assembly or manufacturing equipment and manufacturing downtime. It would therefore be desirable to provide a manufacturing process switch that can stop manufacturing processes when the cable, cord, or hose of a power tool is moved an abnormal distance away from the manufacturing process switch.

BRIEF SUMMARY

In accordance with one embodiment of the present disclosure, a manufacturing process switch may include a housing. The housing may include a first member rotatably attached to a second member, where the first member is rotatable from a closed position to an open position. A proximity sensor is secured to the housing that detects the proximity of the first member to the second member and generates a signal when the first member is in the open position. A cable attachment mechanism is attached to the first member of the housing and securable to a cable of a tool. An engagement device is secured to the housing for retaining the first member to the second member in the closed position. The first member is rotatable from the closed position to the open position when a breakaway force is applied to the cable attachment mechanism. The manufacturing process is stopped when the first member is in the open position and the manufacturing process is operational when the first member is in the closed position.

In accordance with yet another embodiment of the present disclosure a manufacturing system may include a conveyor. The conveyor may be regulated by a controller. A manufacturing process switch is in communication with the controller. A tool with a cable including at least a power tool with power cord and a pneumatic tool with an air hose is coupled to the manufacturing process switch. The manufacturing system also includes a proximity sensor for communicating a conveyor stopping signal to the controller when the tool with a cable is moved an abnormal distance away from the manufacturing process switch.

In accordance with yet another embodiment of the present disclosure, a manufacturing process switch may include a housing. The housing may include a first member rotatably attached to a second member using a spring loaded hinge, where the first member is rotatable from a closed position to an open position. A proximity sensor is secured to the housing that detects the proximity of the first member to the second member and generates a signal when the first member is in the open position. A cable attachment mechanism is attached to the first member of the housing and securable to a cable of a tool. The first member is rotatable from the closed position to the open position when a breakaway force is applied to the cable attachment mechanism. The manufacturing process is stopped when the first member is in the open position and the manufacturing process is operational when the first member is in the closed position.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Description

The apparatus described herein relate generally to a manufacturing process using corded tools. More specifically, the apparatus described herein facilitates stopping a manufacturing process when the corded tool is moved an abnormal distance away.

Drawings

Embodiments are hereinafter described in detail in connection with the views and examples of FIGS. 1-6, wherein like numbers indicate the same or corresponding elements throughout the views. It should, of course, be understood that the description and drawings herein are merely illustrative and that various modifications and changes can be made in the structures disclosed without departing from the concepts of the present disclosure.

Figure 1:
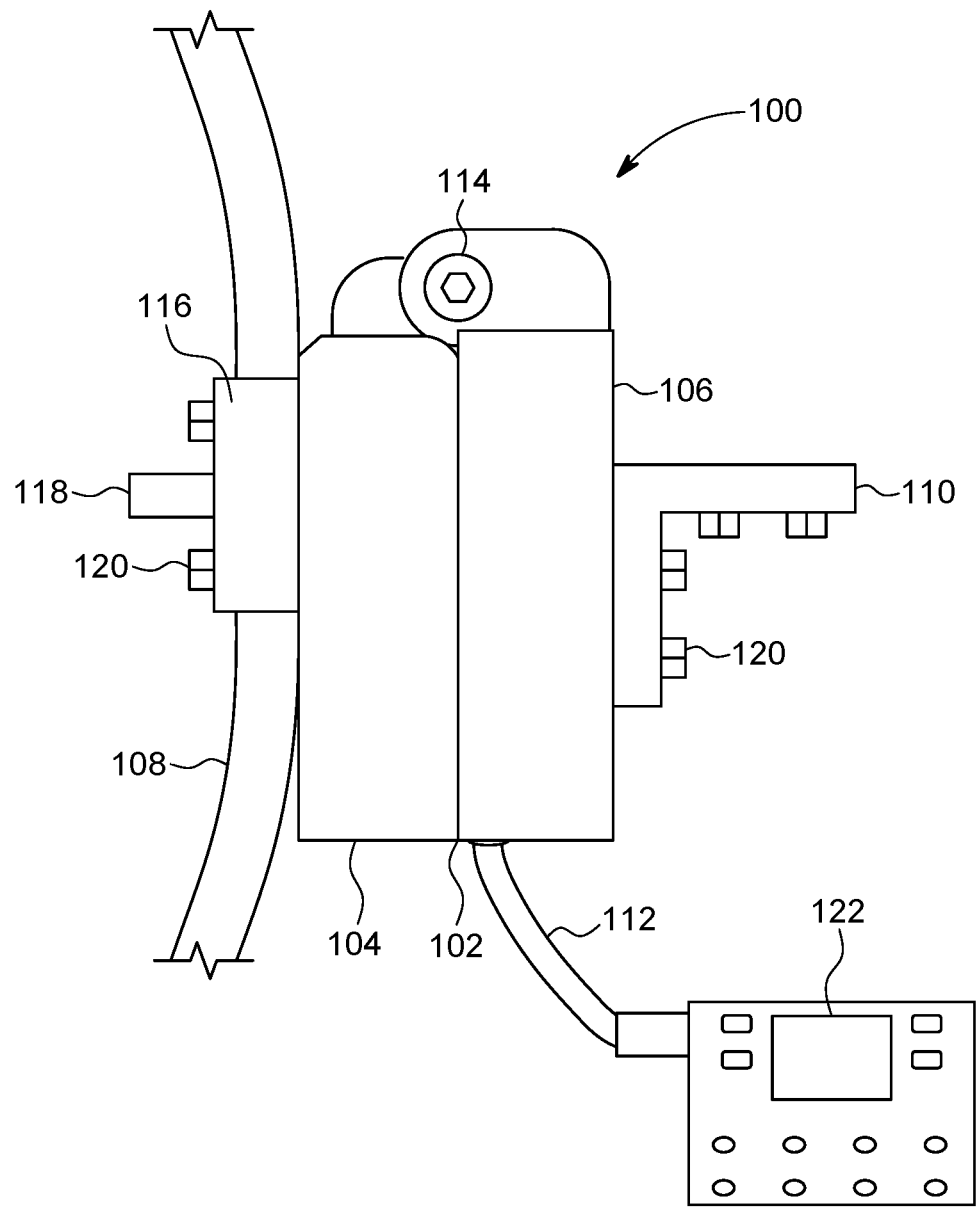
FIG. 1 is a side view of an exemplary embodiment of the manufacturing process switch in a closed position.

FIG. 1 is a side view of an exemplary embodiment of a manufacturing process switch 100 in a closed position. In the exemplary embodiment, the manufacturing process switch 100 includes a housing 102. The housing 102 includes a first member 104 which is rotatably connected using a hinge 114 to a second member 106.

Manufacturing process switch 100 also includes a cable attachment mechanism 116. The cable attachment mechanism 116 is coupled to the first member 104 by at least one fastener 120. Fastener 120 may include a bolt, a screw, a clip, an adhesive or any other type of fastener that allows the manufacturing process switch 100 to function as described herein.

A cable 108 is positioned between the cable attachment mechanism 116 and the first member 104. The cable attachment mechanism 116 and/or the first member 104 may have a recessed surface larger in diameter than the cable 108 for securing the cable 108. The cable 108 is shown to be tubular in shape like that of a power cord for power tool or a pneumatic hose for a pneumatic tool; however, it may also include a rope or chain that is attached to a hand tool. Additionally, the cable attachment mechanism 116 may include an attachment hoop 118 for attaching a tool. For example, a tool may be attached to chain or rope and coupled to the attachment hoop 118 with a clip or a link.

The second member 106 is secured to a bracket 110. The bracket 110 is configured to couple the manufacturing process switch 100 to a stationary member, for example, but not limited to a piece of equipment, a post, a railing or other structural member commonly found in a manufacturing environment using at least one fastener 120 to prevent the second member 106 from rotating. Fastener 120 may include a bolt, a screw, a clip, and adhesive or any other type of fastener that allows the manufacturing process switch 100 to function as described herein.

Figure 2:
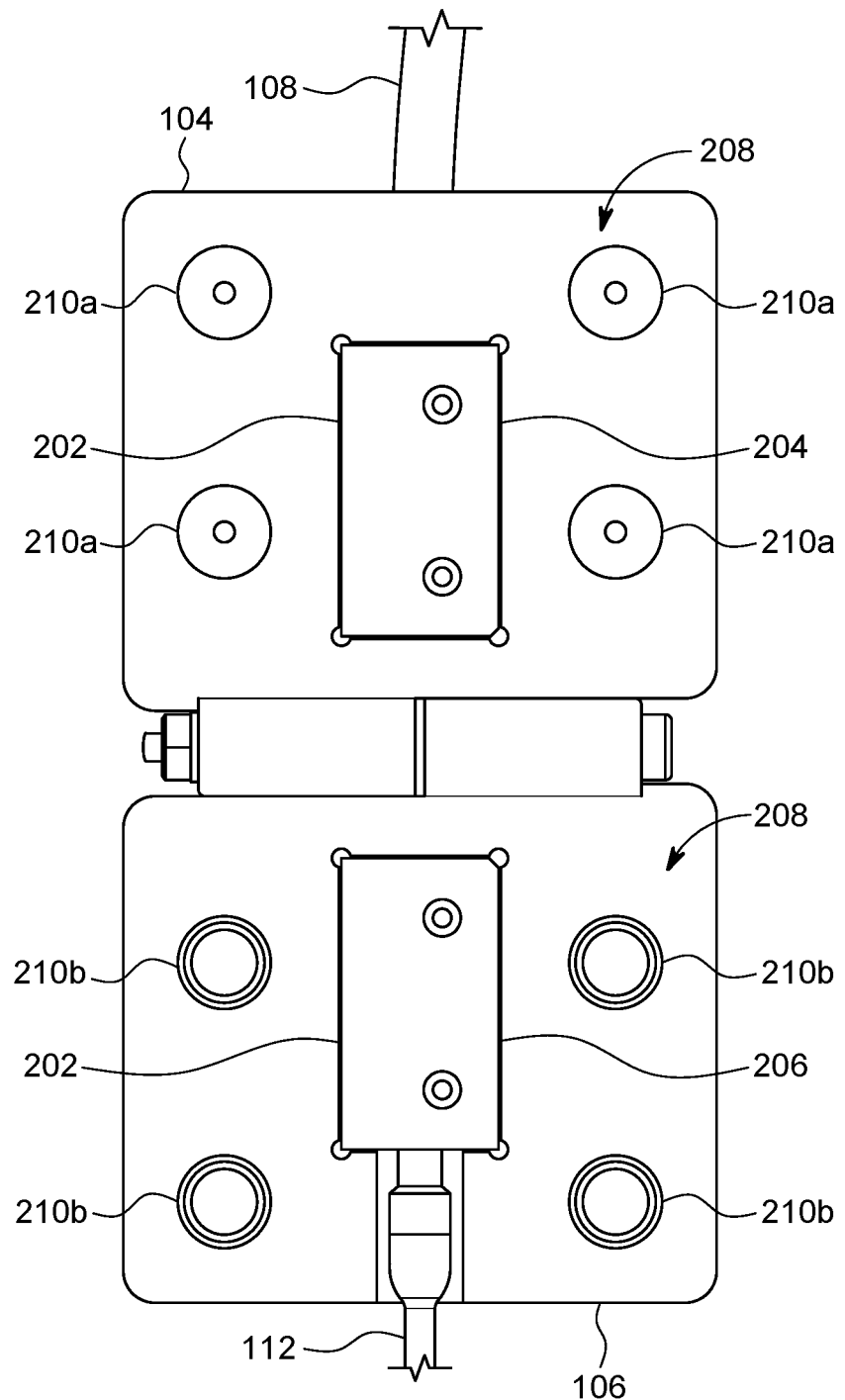
FIG. 2 is a front view of the manufacturing process switch shown in FIG. 1 in an open position.

FIG. 2 is a front view of the manufacturing process switch 100 in an open position. As referred to herein, in the open position, the first member 104 of the housing 102 has been rotated away from the second member 106 of the housing 102. The first member 104 is removably coupled to the second member 106 using an engagement device 208. For example, engagement device 208 may include a magnet 210.

The engagement device 208 is embedded in at least one of the first member 104 and the second member 106 so that they are in alignment and allow the housing 102 to rotate to a closed position. Engagement device 208 may include two magnets of opposite polarity configured to attract the first member 104 toward the second member 106. The engagement device 208 may also include one magnet 210a and a ferrous material 210b configured to do the same. The magnets are selected based on their size and magnetic force to secure the first member 104 to the second member 106 until a breakaway from the cable 108 overcomes the magnetic force.

The manufacturing process switch 100, also includes a proximity sensor 202. The proximity sensor 202 consists of a first portion 204 embedded in the first member 104 of the housing 102 and a second portion 206 embedded in the second member 106. The proximity sensor 202 may include an Adam and Eve non-contact proximity sensor and/or any other type of proximity sensor that allows the manufacturing process switch 100 to function as described herein. The second portion 206 is connected to a controller cable 112 for communicating the status of the proximity sensor 202 to a controller 122. The second portion 206 receives a signal from the first portion 204 when in the closed position or at a predetermined distance away from the first portion 204.

When the first member 104 is rotated away from the second member 106, the second portion 206 of the proximity sensor 202 no longer receives a signal from the first portion 204 of the proximity sensor 202. As a result, the second portion 206 communicates to the controller 122 that the first portion 204 and second portion 206 are no longer within proximity of each other and the manufacturing process switch 100 is in an open position. The controller 122 is one commonly found connected to a manufacturing process, such as a programmable logic controller, central processing units, microprocessors, application specific integrated circuits, and any other circuit or controller capable of executing the functions described herein.

Once the controller 122 receives communication that the first portion 204 of the proximity sensor 202 is no longer within proximity of the second portion 206 of the proximity sensor 202 and the first member 104 is in an open position, it communicates a stop signal to stop proceeding and subsequent manufacturing processes which are also in communication with the controller 122. For example, a conveyor transporting a product while it is being assembled may be stopped when the manufacturing process switch 100 is in an open position and communicates an open position to the controller 122.

Figure 3:
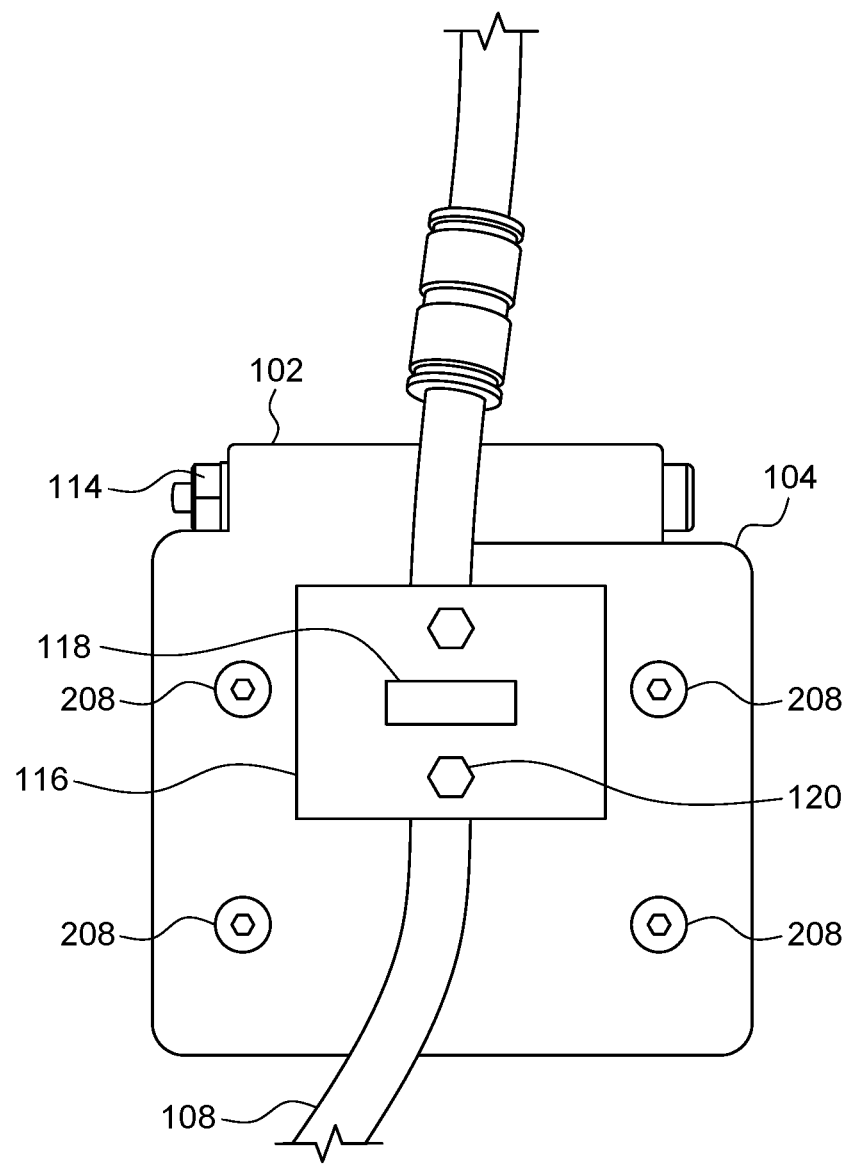
FIG. 3 is a front view of the manufacturing process switch shown in FIG. 1 in a closed position.

FIG. 3 is a front view of the manufacturing process switch 100 in a closed position. As referred to herein, the manufacturing process switch 100 is in the closed position when the first member 104 is engaged with the second member 106 and the proximity sensor 202 detects the first portion 204 is receiving a signal from the second portion 206.

The cable attachment mechanism 116 is shown coupled to the first member 104 using at least one fastener 120. The embedded engagement device 208 are attached using at least one fastener, shown as a allen bolt or a hexagonal socket head but a variety of bolts or other fastening means may be used, such as a screw, a clip or an adhesive which are known to those skilled in the art. The embedded engagement device 208 has a threaded portion, not shown, for mating to a fastener.

Figure 4:
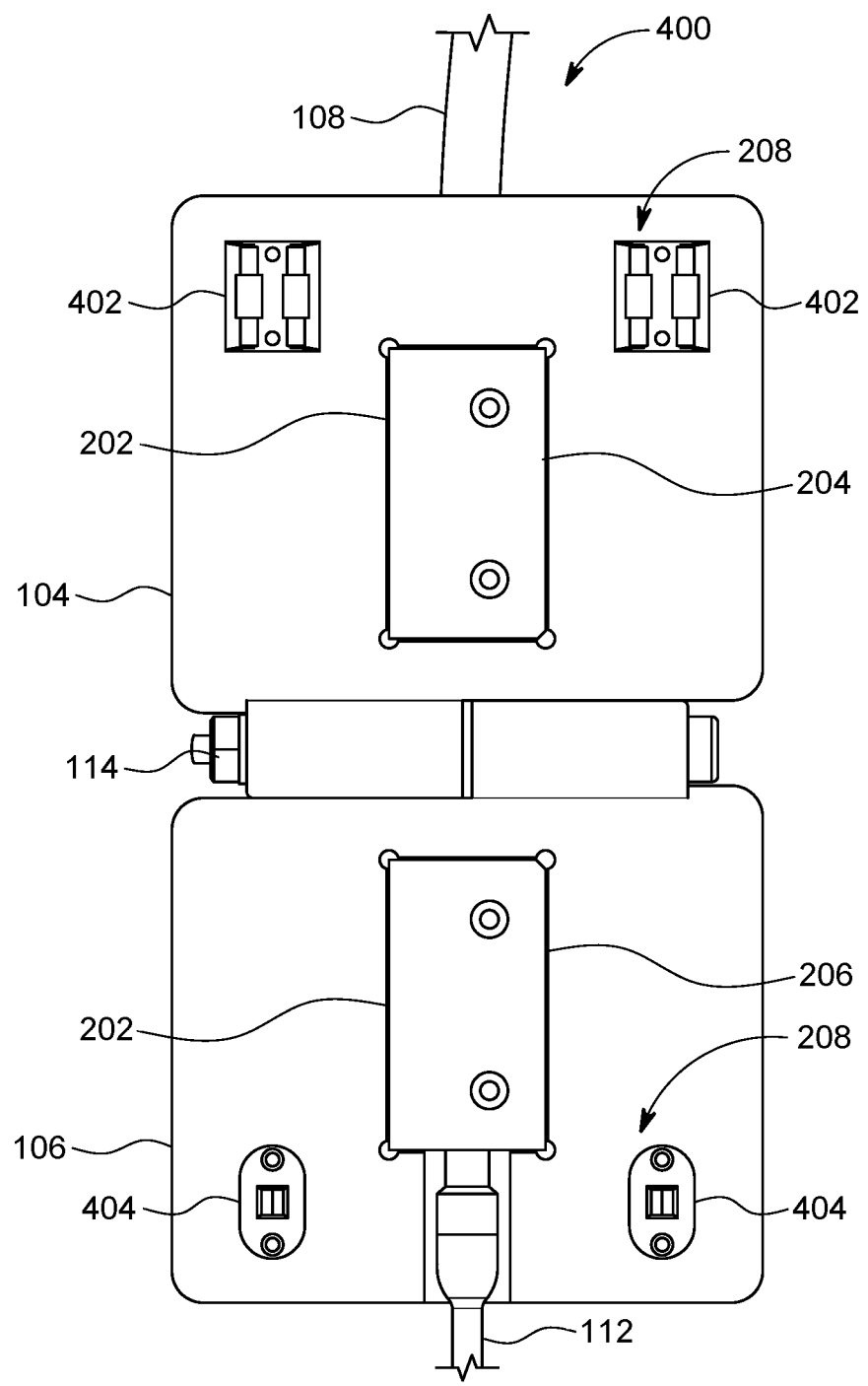
FIG. 4 is a front view of a first alternative embodiment of the manufacturing process switch in an open position.
Figure 5:
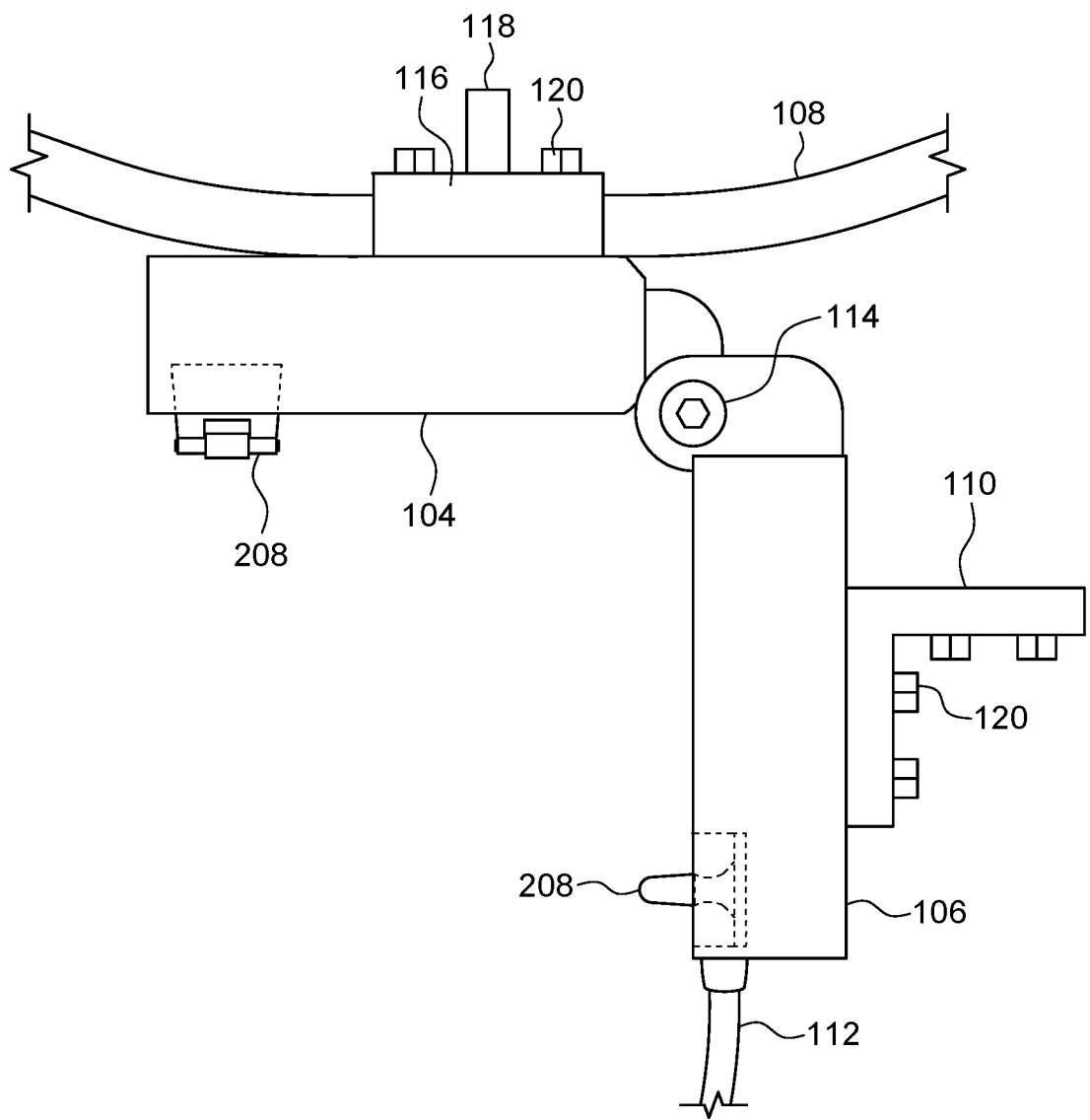
FIG. 5 is a side view of first alternative embodiment of the manufacturing process switch shown in FIG. 4 in an open position.

FIG. 4 is a front view of a first alternative embodiment of a manufacturing process switch 400 of the manufacturing process switch 100 shown in FIGS. 1-3. In FIG. 4, the manufacturing process switch 400 is in an open position. FIG. 5 is a side view the manufacturing process switch 400 in an open position. As described with respect to the manufacturing process switch 100, manufacturing process switch 400 includes first member 104, second member 106, and at least one engagement device 208. The engagement device 208 of the manufacturing process switch 400 includes a catch 402 and a probe 404.

The manufacturing process switch 400 is in the open position when the first member 104 of the housing 102 has been rotated away from the second member 106 of the housing 102. The first member 104 is secured to the second member 106 using an engagement device 208. In FIG. 5, a catch 402 and probe 404 are used as the engagement device 208. The catch 402 is shown on the first member 104 and the probe 404 on the second member 106 but their positions on the first member 104 or second member 106 are interchangeable.

The engagement device 208 is embedded in the first member 104 and second member 106 so that they are in alignment and allow the housing 102 to rotate to a closed position. The catch 402 and the probe 404 are selected based on their size and spring force of the catch 402 to secure the first member 104 to the second member 106 until a breakaway force from the cable 108 causes them to separate.

In the alternative embodiment, a tool with an electrical power cord or pneumatic air hose has moved an abnormal distance away from the manufacturing process where it is being used. To illustrate, the tool may have power cord or air hose shown and described as a cable 108 which is fifteen feet in length to accommodate a manufacturing process where twelve feet of power cord or air hose is needed to assemble a product before it moves on a conveyor to the next manufacturing process. If the tool becomes caught on the conveyor or is inadvertently left on the product as it moves on the conveyor, then the cable 108 will be under tension as it moves an abnormal distance away from the manufacturing process. The resulting tension in the cable 108 causes it to pull against the cable attachment mechanism 116. Once the cable attachment mechanism 116 is pulled at a force that is enough to separate the engagement device 208, the first member 104 will rotate away from the second member 106.

The engagement device 208 in the alternative embodiment is a catch 402 mounted on the first member 104 and a corresponding probe 404 mounted on the second member 106 as shown in FIG. 5. The catch 402 and probe 404 are selected as the engagement device 208 based on the amount of force required to separate the probe 404 from the spring force of the catch 402.

Figure 6:
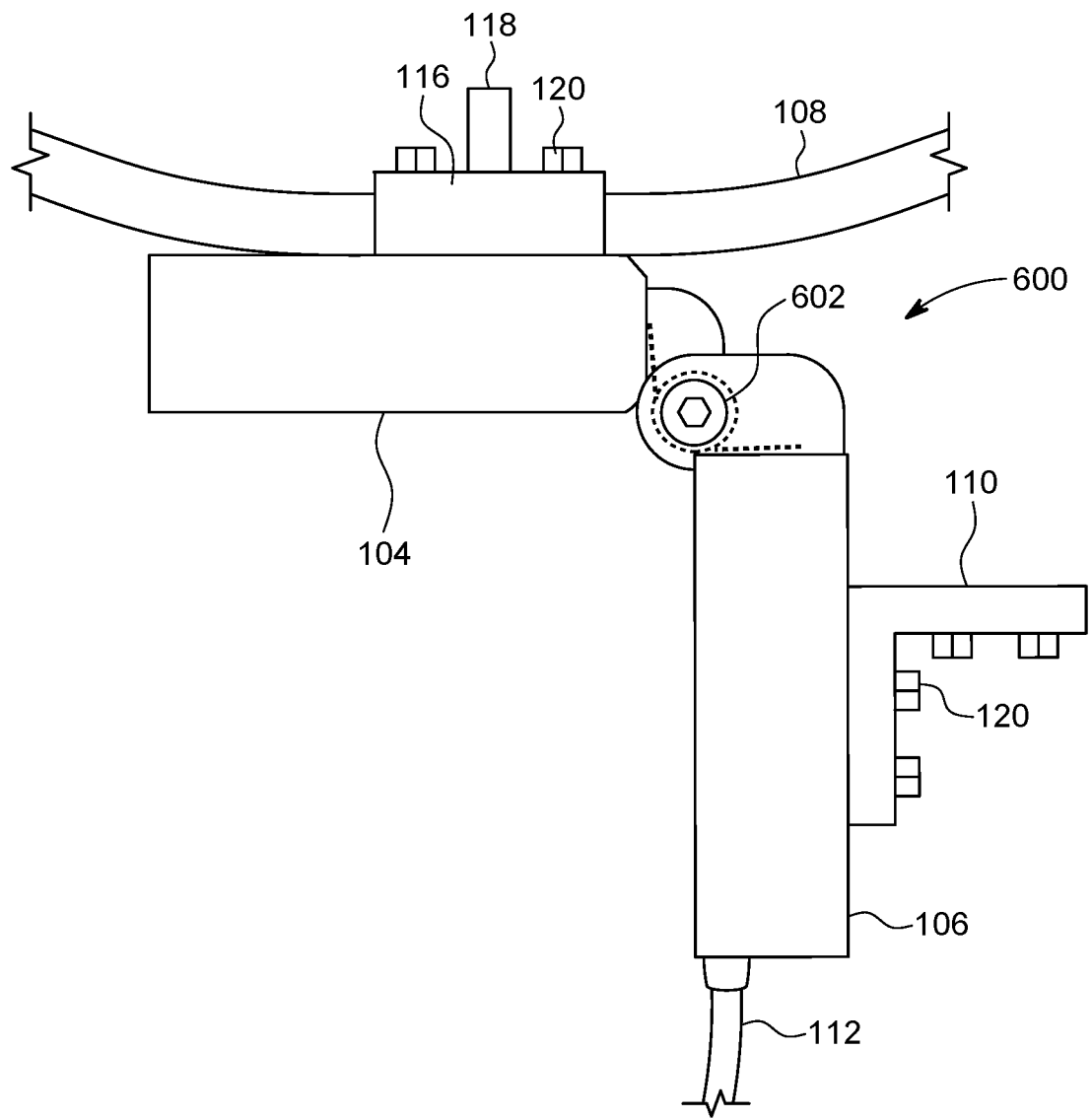
FIG. 6 a side view of a second alternative embodiment of the manufacturing process switch in an open position.

FIG. 6 a side view of a second alternative embodiment manufacturing process switch 600 of manufacturing process switch 100. In the second alternative embodiment, engagement device 208 includes a biasing device, for example, a spring loaded hinge 602. The first member 104 of the manufacturing process switch 600 is kept in a normally closed position via a spring loaded hinge 602.

In the second alternative embodiment, a tool with an electrical power cord or pneumatic air hose has moved an abnormal distance away from the manufacturing process where it is being used. To illustrate, the tool may have power cord or air hose shown and described as a cable 108 which is fifteen feet in length to accommodate a manufacturing process where twelve feet of power cord or air hose is needed to assemble product before it moves on a conveyor to the next manufacturing process. If the tool becomes caught on the conveyor or is inadvertently left on the product as it moves on the conveyor, then the cable 108 will be under tension as it moves an abnormal distance away from the manufacturing process. The resulting tension in the cable 108 causes it to pull against the cable attachment mechanism 116. Once the cable 108 is pulled at a force that is enough to overcome the breakaway force of the spring loaded hinge 602, the first member 104 will rotate away from the second member 106 as shown in FIG. 6

The foregoing description of embodiments and examples has been presented for purposes of illustration and description. It is not intended to be exhaustive or to limit the invention to the forms described. Numerous modifications are possible in light of the above teachings. Some of those modifications have been discussed and others will be understood by those skilled in the art. The embodiments were chosen and described in order to best illustrate certain principles and various embodiments as are suited to the particular use contemplated.

Embodiments are also intended to include or otherwise cover methods of using and methods of manufacturing the manufacturing process switches disclosed above. The methods of manufacturing include or otherwise cover processors and computer programs implemented by processors used to design various elements of the manufacturing process switch disclosed above. For example, embodiments are intended to cover processors and computer programs used to design or manufacture the various components of the manufacturing process switches used for various manufacturing processes.

The scope of the invention is, of course, not limited to the examples or embodiments set forth herein, but can be employed in any number of applications and equivalent devices by those of ordinary skill in the art. Rather it is hereby intended the scope of the invention be defined by the claims appended hereto.

What is claimed is:

1. A manufacturing process switch comprising:
    a housing comprising a first member rotatably coupled to a second member; the first member is rotatable between a closed position and an open position;
    a proximity sensor that detects a proximity of the first member to the second member and generates a signal when the first member is in the open position;
    a cable attachment mechanism secured to the housing that is securable to a cable of a tool; and
    an engagement device secured to the housing that retains the first member to the second member in the closed position, wherein the first member is rotatable from the closed position to the open position when a breakaway force is applied to the cable attachment mechanism.

2. The manufacturing process switch according to claim 1, wherein the first member is rotatably attached to the second member with a hinge.

3. The manufacturing process switch according to claim 1, wherein the proximity sensor includes a first portion that is embedded in the first member.

4. The manufacturing process switch according to claim 1, comprising a manufacturing process in electrical communication with the proximity sensor; wherein the manufacturing process is stopped when the first member is in the open position and the manufacturing process is operational when the first member is in the closed position.

5. The manufacturing process switch according to claim 4, comprising a controller in communication with the proximity sensor; wherein the controller stops operations of the manufacturing process when the proximity sensor detects the first member is in the open position.

6. The manufacturing process switch according to claim 5, wherein a second portion is connected to the controller.

7. The manufacturing process switch according to claim 1, wherein the cable attachment mechanism is secured to the first member and includes a slotted area for securing the cable of a tool.

8. The manufacturing process switch according to claim 1, wherein the engagement device includes at least one magnet embedded in the first member and the second member.

9. The manufacturing process switch according to claim 8, wherein the magnets in the first member and the second member create a magnetic force requiring a predetermined breakaway force to rotate the first member to the open position.

10. The manufacturing process switch according to claim 1, wherein the engagement device includes at least one catch mounted on the first member or the second member and one corresponding probe mounted on the opposing member of the housing.

11. The manufacturing process switch according to claim 10, wherein the catch is spring loaded so a predetermined force is required to insert the probe into the catch or remove the probe from the catch.

12. The manufacturing process switch according to claim 1; wherein the first member is in the open position causing the first portion of the proximity sensor to lose the expected signal from the second portion of the proximity sensor and communicate to the controller to stop the manufacturing process.

13. The manufacturing process switch according to claim 1; wherein the first member is in the open position causing the first portion of the proximity sensor to lose the expected signal from the second portion of the proximity sensor and communicate to the controller to stop the manufacturing process.

14. A manufacturing system comprising:
    a conveyor;
    a controller for regulating movement of the conveyor;
    a manufacturing process switch in communication with the controller;
    a tool with a cable including at least a power tool with a power cord and a pneumatic tool with an air hose is coupled to the manufacturing process switch; and a proximity sensor for communicating a conveyor stopping signal to the controller when the tool with a cable is moved an abnormal distance away from the manufacturing process switch.

15. The manufacturing system of claim 14, wherein the tool with cable is coupled to the manufacturing process switch with a cable attachment mechanism.

16. The manufacturing system of claim 14, wherein the manufacturing process switch includes a housing with a first member rotatably coupled to a second member.

17. The manufacturing system of claim 16, wherein the manufacturing process switch includes an engagement device secured to the housing that retains the first member to the second member in the closed position until a breakaway force is applied from the tool with a cable.

18. A manufacturing process switch comprising:
a housing comprising a first member rotatably attached to a second member using a spring loaded hinge; the first member is rotatable from a closed position to an open position;
a proximity sensor secured to the housing that detects the proximity of the first member to the second member and generates a signal when the first member is in the open position; and
a cable attachment mechanism secured to the first member that is securable to a cable of a tool; wherein the first member is rotatable from the closed position to the open position when a breakaway force is applied to the cable attachment mechanism.

19. The manufacturing process switch of claim 18, wherein the spring loaded hinge requires a predetermined breakaway force in order for the first member to rotate to the open position.

20. The manufacturing process switch of claim 18, comprising a manufacturing process in electrical communication with the proximity sensor; wherein the manufacturing process is stopped when the first member is in the open position and the manufacturing process is operational when the first member is in the closed position.

* * * * *